US012693593B2

(12) United States Patent 
Ho et al.

(10) Patent No.: US 12,693,593 B2 
(45) Date of Patent: Jul. 28, 2026

(54) PATTERN FORMATION METHOD AND MANUFACTURING METHOD OF SEMICONDUCTOR DEVICE

(71) Applicant: TAIWAN SEMICONDUCTOR MANUFACTURING COMPANY, LTD., Hsinchu (TW)

(72) Inventors: Wei-De Ho, Hsinchu City (TW); Han-Wei Wu, Tainan City (TW); Yuan-Hsiang Lung, Hsinchu City (TW); Hua-Tai Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 777 days.

(21) Appl. No.: 17/708,941

(22) Filed: Mar. 30, 2022

(65) Prior Publication Data

US 2023/0139799 A1 May 4, 2023

Related U.S. Application Data

(60) Provisional application No. 63/275,671, filed on Nov. 4, 2021.

(51) Int. Cl. 
 G03F 1/70 (2012.01)

(52) U.S. Cl. 
 CPC ..................................... G03F 1/70 (2013.01)

(58) Field of Classification Search 
 CPC ..... G03F 1/70; G03F 7/70091; G03F 7/70433 
 See application file for complete search history.

(56) References Cited

U.S. PATENT DOCUMENTS

| | | | |
|---|---|---|---|
| 7,139,064 B2 | 11/2006 | Nam et al. | |
| 10,962,875 B2 | 3/2021 | Huang et al. | |
| 10,996,567 B2 | 5/2021 | Baselmans et al. | |
| 2005/0105072 A1* | 5/2005 | Nam ................... | G03F 7/70108 430/30 |

(Continued)

FOREIGN PATENT DOCUMENTS

WO 2007/030528 A2 3/2007

OTHER PUBLICATIONS

Mijung Lim et al., "EUV contact-hole local CD uniformity optimization for DRAM Storage Node application," Proc. of SPIE, vol. 10583, Extreme Ultraviolet (EUV) Lithography IX, 105830X (May 1, 2018); doi:10.1117/12.2299322.

*Primary Examiner* — Jonathan Johnson 
*Assistant Examiner* — Jayson D Cosgrove 
(74) *Attorney, Agent, or Firm* — STUDEBAKER BRACKETT PLLC

(57) ABSTRACT

In pattern formation method, a photomask is loaded into a lithography apparatus, an exposure light is applied to a photo resist layer formed over a substrate through or via the photomask, and the photo resist layer is developed. The photomask includes a plurality of octagonal shape patterns periodically arranged in a first direction and a second direction crossing the first direction. A width Lx of horizontal sides extending in the first direction of each of the plurality octagonal shape patterns is different from a width Ly of vertical sides extending in the second direction of each of the plurality octagonal shape patterns.

20 Claims, 10 Drawing Sheets

(56) References Cited

U.S. PATENT DOCUMENTS

2007/0184390 A1*  8/2007  Kawashima ........ G03F 7/70425
                                                        430/311
2009/0314950 A1*  12/2009  Iizuka ................. H01J 37/3174
                                                        250/397
2009/0325082 A1*  12/2009  Ryu .......................... G03F 1/29
                                                        430/311
2015/0042935 A1*  2/2015  Yamamoto ........ G02F 1/133512
                                                        349/112
2018/0046073 A1*  2/2018  Rankin ................. G03F 7/2037

* cited by examiner

1000

1120

1140
1145

1200
1210

1100

1300

1010
1020

2200                2205c        2000

2100        2205a                2205e

2105

ZE                              2205d

2205b

2110

2210

S701 — Preparing pattern layout

S702 — Modifying pattern shape based on the pattern layout

S703 — Manufacturing photomask

S704 — Modifying hexapole illumination system based on the pattern layout

S705 — Performing lithography operation by using the photomask and modified hexapole illumination

PATTERN FORMATION METHOD AND MANUFACTURING METHOD OF SEMICONDUCTOR DEVICE

RELATED APPLICATIONS

This application claims priority to U.S. Provisional Patent Application No. 63/275,671 filed on Nov. 4, 2021, the entire contents of each of which are incorporated herein by reference.

BACKGROUND

An optical lithography process transfers a layout pattern of a photo mask to the wafer such that etching, implantation, or other steps are applied only to predefined regions of the wafer. Transferring the layout pattern of the photo mask to the resist layer on the wafer may cause resist pattern non-uniformity that is a major challenge in semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
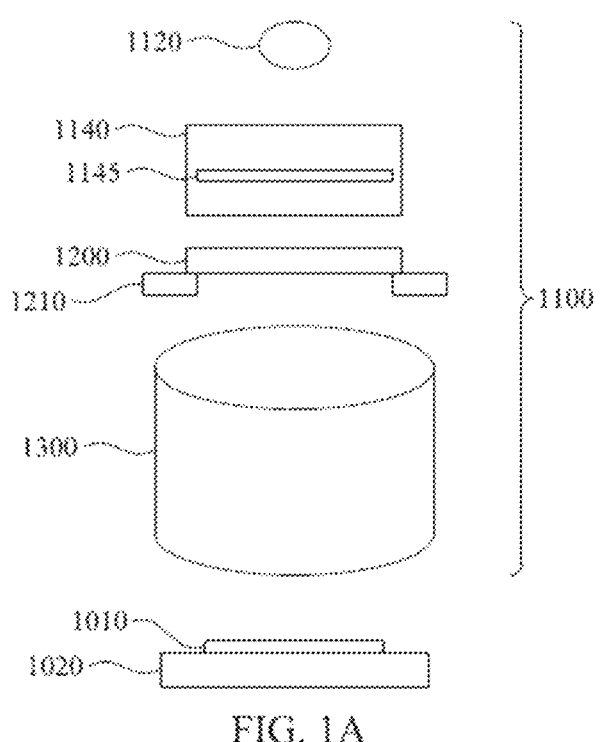
FIGS. 1A and 1B show schematic diagrams of an exposure apparatus in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Photolithography processes are performed to form a photoresist pattern on a target layer formed on a semiconductor substrate (wafer). The photoresist pattern is used as a mask in an etching process for forming the specific pattern and in an ion implantation process to selectively introduce impurities. Patterns formed on the semiconductor substrates have gradually decreased in size, having finer features, as an integration degree of semiconductor devices has increased. Accordingly, improvement of lithographic properties, such as resolution, depth of focus (DOF) and critical dimension (CD) uniformity, in the photolithography process have become more important.

One of the techniques to improve the lithographic properties is the use of an off-axis illumination (OAI) by projecting a zero-order diffracted light beam and positive first-order diffracted light beam occurring from the photo mask onto the semiconductor substrate. Examples of the OAI may include an annular illumination (AI), a dipole illumination, quadrupole illumination, or the like.

In the present disclosure, patterns on the photomask are adjusted, modified and/or optimized to improve CD uniformity when using an off-axis illumination.

Figure 1B:
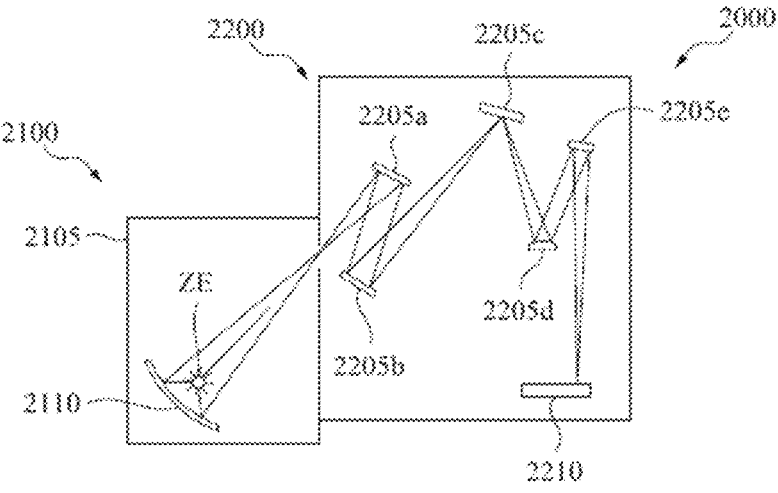

FIGS. 1A and 1B show a schematic view of an optical lithography system according to an embodiment of the present disclosure. In FIG. 1A, an exposure apparatus 1000 is a deep ultraviolet (DUV) optical scanner or a DUV optical stepper, and in FIG. 1B, an exposure apparatus 200 is an extreme UV (EUV) scanner.

As shown in FIG. 1A, the exposure apparatus 1000 includes an optical system 1100 for irradiating a light beam onto a photoresist layer formed on the semiconductor wafer 1010, and a stage 1020 for supporting and moving the semiconductor wafer 1010. The optical system 1100 includes a light source 1120, an illumination optical system 1140, a mask stage 1210 on which a photo mask 1200 is placed, and a projection lens system 1300. The light source 1120 includes one of a UV lamp, a DUV laser source (e.g., a KrF excimer laser source or an ArF excimer laser source). The illumination optical system 1140 is employed for forming a first light beam generated from the light source 1120 into an off-axis illumination beam having multiple beams (e.g., quadrupoles or hexapole). The illumination optical system includes an aperture plate (aperture stop) 1145 having a plurality of openings to realize the off-axis illumination. The off-axis illumination beam is directed to one or more illumination lenses in the illumination optical system 1140, and the illumination lenses direct the off-axis illumination beam onto the photo mask 1200. The projection lens 1300 projects a second light beam, received through the photo mask 1200, onto the photoresist layer on the semiconductor wafer 1010.

Unlike the exposure apparatus 1000 using an optical lens system, an EUV exposure apparatus 2000 employs a reflective optical system, as shown in FIG. 1B. FIG. 1B is a simplified schematic diagram of an EUV exposure apparatus according to an embodiment of the disclosure showing the exposure of a photoresist-coated substrate 2210 with a patterned beam of EUV light. The exposure apparatus 2200 is an integrated circuit lithography tool such as a stepper, scanner, step and scan system, direct write system, device using a contact and/or proximity mask, etc., provided with one or more optics 2205a, 2205b, for example, to illuminate a patterning optic 2205c, such as a photomask, with a beam of EUV light, to produce a patterned beam, and one or more reduction projection optics 2205d, 2205e, for projecting the patterned beam onto the substrate 2210. A mechanical assembly (not shown) may be provided for generating a controlled relative movement between the substrate 2210 and patterning optic 2205c. As further shown in FIG. 1B, the EUV exposure apparatus includes an EUV light source 2100 including an EUV light radiator ZE emitting EUV light in a chamber 2105 that is reflected by a collector 2110 along a path into the exposure device 2000 to irradiate the substrate 2210.

In some embodiments, the photomask (reticle) 2205c is held by an electrostatic chuck, which are positioned such that radiation EUV supplied from the EUV radiation source is in focus when it arrives at the surface of the semiconductor wafer. In some embodiments, a hydrogen gas flow is provided along the surface of the photomask 2205c. In some embodiments, an aperture plate is provided between the EUV light source 2100 and the photomask 2205c to realize an off-axis illumination, such as quadrupole or hexapole illumination.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s) such as at the EUV output light wavelength, the irradiation laser wavelength, a wavelength suitable for metrology or any other specific wavelength.

In some embodiments, locations and/or sizes of each of the openings on the aperture plate for a multipole illumination are adjusted or optimized based on the patterns formed on the photomask (the patterns to be projected over the semiconductor wafer).

Figure 2:
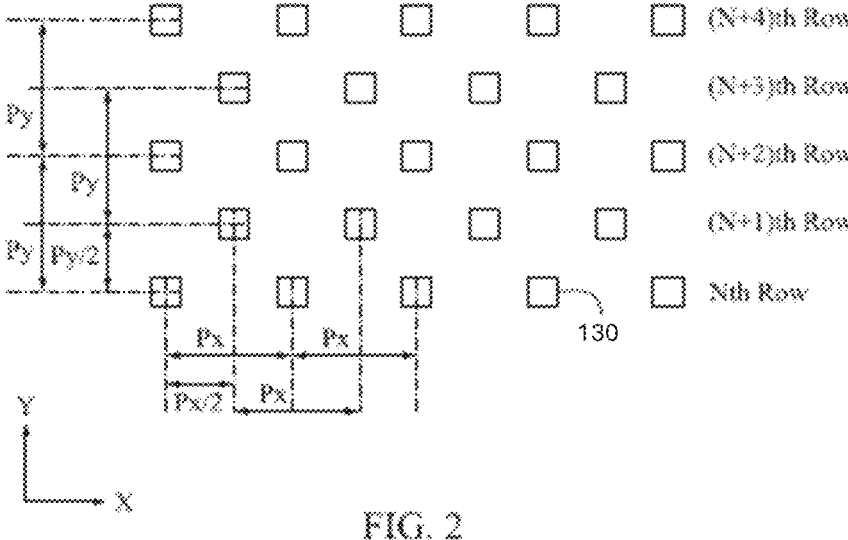
FIG. 2 shows a staggered pattern layout according to an embodiment of the present disclosure.

In some embodiments of the present disclosure, the mask pattern includes a plurality of patterns 130 arranged in a staggered matrix as shown in FIG. 2. In some embodiments, the plurality of patterns 130 are openings through which the exposure light passes, and in other embodiments, the plurality of patterns 130 are island patterns by which the exposure light is blocked (opaque). In some embodiments, the plurality of patterns 130 are for a plurality of storage node patterns or contact hole patterns of a dynamic random access memory.

As shown in FIG. 2, the plurality of patterns 130 is arranged in a staggered matrix. The staggered matrix includes a plurality of rows. The plurality of rows includes even number rows in which some of the plurality of patterns 130 are periodically arranged with a first pitch Px along the X direction, and odd number rows in which some of the plurality of patterns are periodically arranged with the first pitch Px along the X direction. The even number rows are periodically arranged with a pitch Py along the second direction, and the odd number rows are periodically arranged with the pitch Py along the second direction. The even number rows and the odd number rows are periodically arranged with a pitch Py/2 along the second direction, and the odd number rows are shifted along the first direction by Px/2 with respect to the even number rows.

In FIG. 2, in the Nth, (N+2)th and (N+4)th rows, a plurality of patterns 130 are periodically arranged with the pitch Px along the X direction. The Nth, (N+2)th and (N+4)th rows are arranged with the pitch Py along the Y direction. In the (N+1)th and (N+3)th rows, a plurality of patterns 130 are periodically arranged with the pitch Px along the X direction, and the (N+1)th and (N+3)th rows are arranged with the pitch Py along the Y direction. The patterns in the (N+1)th and (N+3)th rows shift along the X direction by the amount of Px/2, and the pitch of the Nth, (N+1)th, (N+2)th, (N+3)th and (N+4) the rows is Py/2. In some embodiments, N is a natural number up to, for example, 252, 508 or 1020.

In some embodiments, each of the plurality of patterns 130 is a square pattern having a width in a range from about 30-50 nm on a wafer (about 120-200 nm on the 4X photomask).

Figure 3:
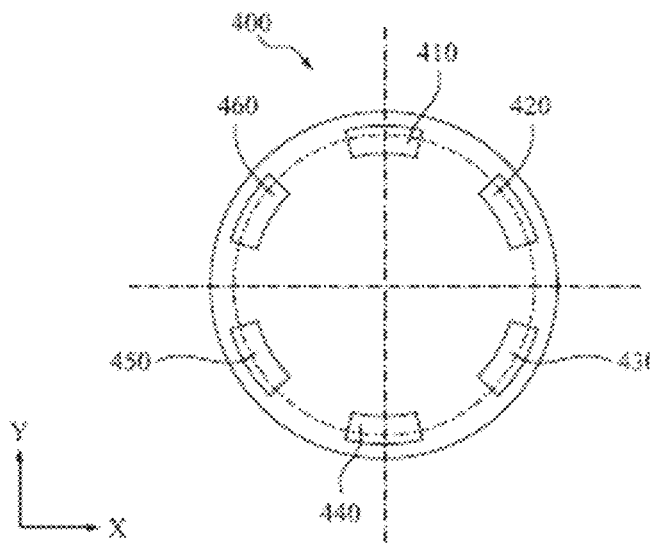
FIG. 3 shows a view of an aperture plate according to an embodiment of the present disclosure.

In some embodiments, the off-axis illumination is adjusted based on the arrangement of the plurality of patterns 130. In some embodiments, the off-axis illumination is a hexapole illumination. FIG. 3 shows an aperture plate 400 to realize the hexapole illumination. The aperture plate 400 includes a first opening 410 for the first pole, a second opening 420 for the second pole, a third opening 430 for the third pole, a fourth opening 440 for the fourth pole, a fifth opening 450 for the fifth pole and a sixth opening 460 for the sixth pole arranged along a circle in a clockwise direction. In some embodiments, the aperture plate 440 is a solid plate having through holes and in other embodiments, the aperture plate 440 includes a mechanism to adjust a light transmissive area (corresponding to the opening) and/or a light intensity passing through the transmissive area. The mechanism includes a liquid crystal panel in some embodiments.

The shape of the openings 410-460 includes one or more of a circle, an oval, a square, a rectangular, or a partial fan shape as shown in FIG. 3. In some embodiments, the line connecting the center of the first opening 410 and the center of the fourth opening 440 (or opposite poles) is parallel to (located on) the Y axis as shown in FIG. 3. In other embodiments, the line connecting the center of the first opening 410 and the center of the fourth opening 440 is parallel to (located on) the X axis.

The X-axis and the X-axis shown in FIGS. 2 and 3 are arranged on an illuminated plane or the wafer plane that is substantially perpendicular to the optical axis of the illumination system. The X-axis and the Y-axis correspond to the pattern arrangement direction and are parallel to sides of one exposure area.

The inventors of the present disclosure have found that when a rectangular, for example a square, pattern is used as each of the plurality of patterns 130, the CD uniformity may not achieve a desired value (large variation in CD). However, the inventors have found that non-rectangular shape, such as an octagonal shape, can improve the CD uniformity.

Figure 4:
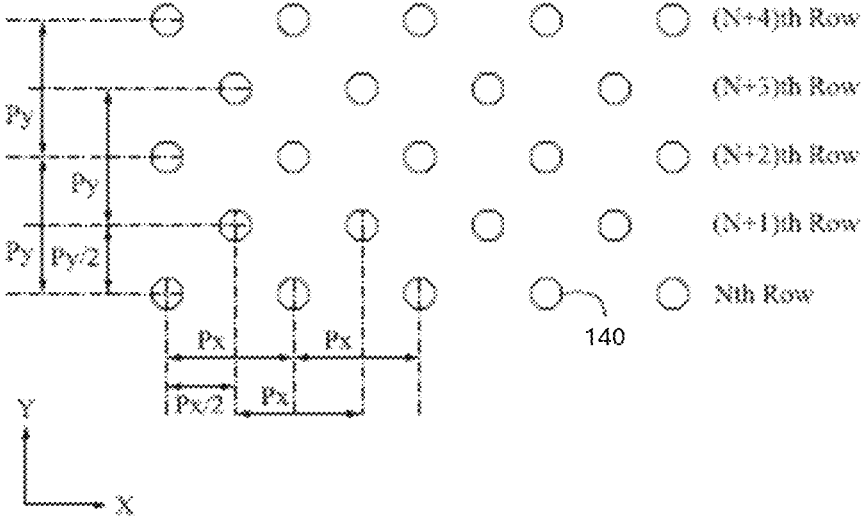
FIG. 4 shows a staggered pattern layout according to an embodiment of the present disclosure.
Figure 5:
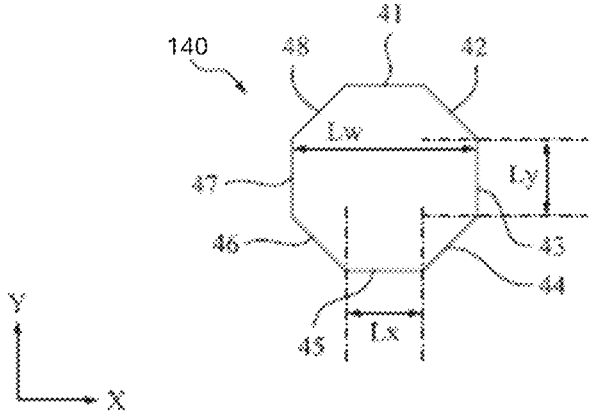
FIG. 5 shows an octagonal pattern according to an embodiment of the present disclosure.

FIG. 4 shows a pattern layout of a plurality of octagonal shape patterns 140 arranged in a staggered matrix, and FIG. 5 shows an enlarged view of one of the plurality of octagonal shape patterns 140.

Similar to FIG. 2, the plurality of octagonal shape patterns 140 are arranged in a staggered matrix. The staggered matrix includes a plurality of rows. The plurality of rows includes even number rows in which some of the plurality of octagonal shape patterns 140 are periodically arranged with a first pitch Px along the X direction, and odd number rows in which some of the plurality of octagonal shape patterns are periodically arranged with the first pitch Px along the X direction. The even number rows are periodically arranged with a pitch Py along the second direction, and the odd number rows are periodically arranged with the pitch Py along the second direction. The even number rows and the odd number rows are periodically arranged with a pitch Py/2 along the second direction, and the odd number rows are shifted along the first direction by Px/2 with respect to the even number rows.

In FIG. 4, in the Nth, (N+2)th and (N+4)th rows, a plurality of octagonal shape patterns 140 are periodically arranged with the pitch Px along the X direction. The Nth, (N+2)th and (N+4)th rows are arranged with the pitch Py along the Y direction. In the (N+1)th and (N+3)th rows, a plurality of octagonal shape patterns 140 are periodically arranged with the pitch Px along the X direction, and the (N+1)th and (N+3)th rows are arranged with the pitch Py along the Y direction. The patterns in the (N+1)th and (N+3)th rows are shifted along the X direction by the amount of Px/2, and the pitch of the Nth, (N+1)th, (N+2)th, (N+3)th and (N+4) the rows is Py/2. In some embodiments, N is a natural number up to, for example, 252, 510 or 1020.

In FIG. 4, in the Nth, (N+2)th and (N+4)th rows, a plurality of octagonal shape patterns 40 are periodically arranged with the pitch Px along the X direction. The Nth, (N+2)th and (N+4)th rows are arranged with the pitch Py along the Y direction. In the (N+1)th and (N+3)th rows, a plurality of octagonal shape patterns 40 are periodically arranged with the pitch Px along the X direction, and the (N+1)th and (N+3)th rows are arranged with the pitch Py along the Y direction. The patterns in the (N+1)th and (N+3)th rows are shifted along the X direction by the amount of Px/2, and the pitch of the Nth, (N+1)th, (N+2)th, (N+3)th and (N+4) the rows is Py/2. In some embodiments, N is a natural number up to, for example, 252, 510 or 1020.

In some embodiments, Px is different from Py. In some embodiments. Px is smaller than Py. In some embodiments, Px is in a range from about 75 nm to about 125 nm on the wafer (300 nm≤Px≤500 on the 4× photomask). In some embodiments, Py is in a range from about 120 nm to about 200 nm on the wafer (480 nm≤Py≤800 nm on the 4× photomask). In other embodiments. Px is greater than Py. In some embodiments, Py is in a range from about 75 nm to about 125 nm on the wafer (300 nm≤Py≤500 on the 4× photomask). In some embodiments, Px is in a range from about 120 nm to about 200 nm on the wafer (480 nm≤Px≤800 nm on the 4× photomask).

As shown in FIG. 5, the octagonal shape 140 has two horizontal sides (top 41 and bottom 45), two vertical sides (left 47 and right 43) and four oblique sides, 42, 44, 46 and

48. In some embodiments, the widths of two horizontal sides 41 and 45 are equal to each other, which is Lx. In some embodiments, the widths of two vertical sides 43 and 47 are equal to each other, which is Ly. In some embodiments, the pattern 140 is a polygonal shape having at least four sides, and a width Lw of the polygonal shape is greater than the width Lx.

In some embodiments, the pattern layout shown in FIG. 4 is generated from the pattern layout shown in FIG. 2 by modifying the rectangular (square) pattern into the octagonal shape pattern. In some embodiments, the conversion is made based on the pitches Px and Py. In the conversion, when Px is smaller than Py, Lx is set greater than Ly in some embodiments. In some embodiments, when Px<Py and Lx>Ly, Px/Py is in a range from about 0.5 to about 0.7 and Lx/Ly is more than 1, for example, in a range from about 1.05 to about 1.15. In other embodiments, when Px is smaller than Py, Lx is set smaller than Ly. In some embodiments, when Px<Py and Lx<Ly, Px/Py is in a range from about 0.5 to about 0.7 and Lx/Ly is smaller than 1, for example, in a range from about 0.85 to about 0.95. In other embodiments, when Px is greater than Py, Lx is set smaller than Ly. In some embodiments, when Px>Py and Lx<Ly, Py/Px is in a range from about 0.5 to about 0.7 and Ly/Lx is more than 1, for example, in a range from about 1.05 to about 1.15. When the dimensions are within these ranges, the CD uniformity can be improved, and if the dimensions are out of these ranges, the CD uniformity does not satisfy the desired value in some embodiments.

In some embodiments, the conversion from the square shape to the octagonal shape is performed such that the area of the octagonal shape is within ±10% of the area of the original square shape. In other embodiments, the area of the octagonal shape is within ±5% of the area of the original square shape. These ranges do not substantially affect exposure parameters, such as exposure time or dose amount during the exposure operation.

In some embodiments, Lx and Ly are in a range from about 20-40 nm on the wafer (about 80-140 nm on the 4× photomask).

It is noted that shapes and size of the patterns as shown in the drawings are ideal or designed patterns on layout data (e.g., in GDS (graphic design system) II data), and in the actual photomask, the corners of the octagonal shape patterns may be rounded. In the present disclosure, the rounded corner octagonal shape is considered as an octagonal shape.

In some embodiments, the configuration of the hexapole illumination is also modified based on the pattern layout, in particular the first pitch Px and the second pitch Py.

Figure 6A:
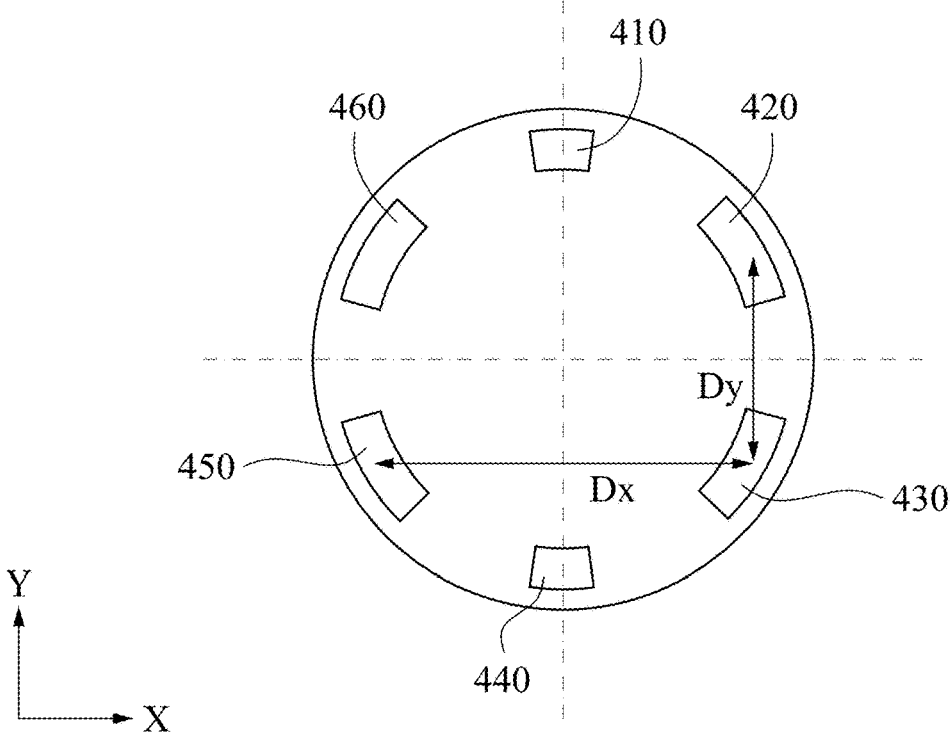
FIGS. 6A, 6B, and 6C show views of an aperture plate according to embodiments of the present disclosure.

In some embodiments, as shown in FIG. 6A, the distance (center-to-center distance) Dx between the third opening 430 for the third pole and the fifth opening 450 for the fifth pole is different from the distance (center-to-center distance) Dy between the second opening 420 for the second pole and the third opening 430 for the third pole, when the pitch Px is smaller than the pitch Py. In some embodiments, the distance between the third opening 430 for the third pole and the fifth opening 450 for the fifth pole is equal to the distance between the second opening 420 for the second pole and the sixth opening 460 for the sixth pole, and the distance between the second opening 420 for the second pole and the third opening 430 for the third pole is equal to the distance between the fifth opening 450 for the fifth pole and the sixth opening for the sixth pole. In some embodiments, when Px is smaller than Py, Lx is greater than Ly and Dx is greater than Dy. In some embodiments, Px/Py is in a range from about 0.5 to about 0.7, Lx/Ly is in a range from about 1.05 to 1.15 and Dx/Dy is in a range from about 1.5 to 1.7. When the dimensions are within these ranges, the CD uniformity can be improved, and if the dimensions are out of these ranges, the CD uniformity does not satisfy the desired value in some embodiments.

In other embodiments, when Py is smaller than Px, Ly is greater than Lx and Dy is greater than Dx.

Figure 6B:
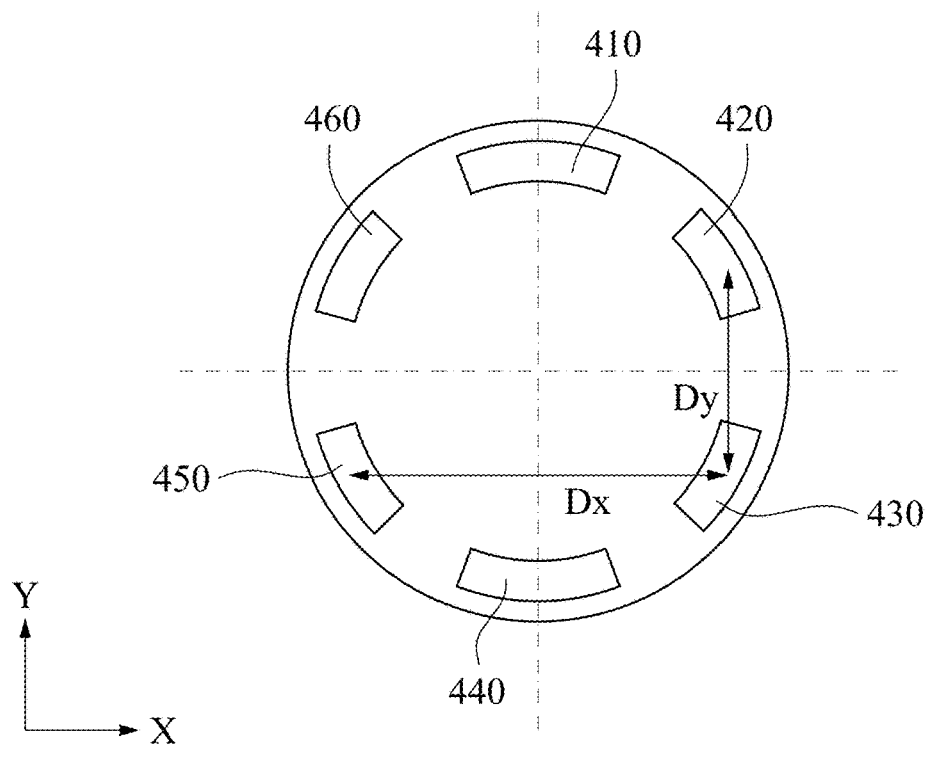

In some embodiments, the area of one of the openings of the aperture plate 400 is different from the area of another of the openings. In some embodiments, the areas of the first opening 410 for the first pole and the fourth opening 440 of the fourth pole are smaller than the areas of the remaining openings as shown in FIG. 6A. In other embodiments, the areas of the first opening 410 for the first pole and the fourth opening 440 of the fourth pole are greater than the areas of the remaining openings as shown in FIG. 6B.

Figure 6C:
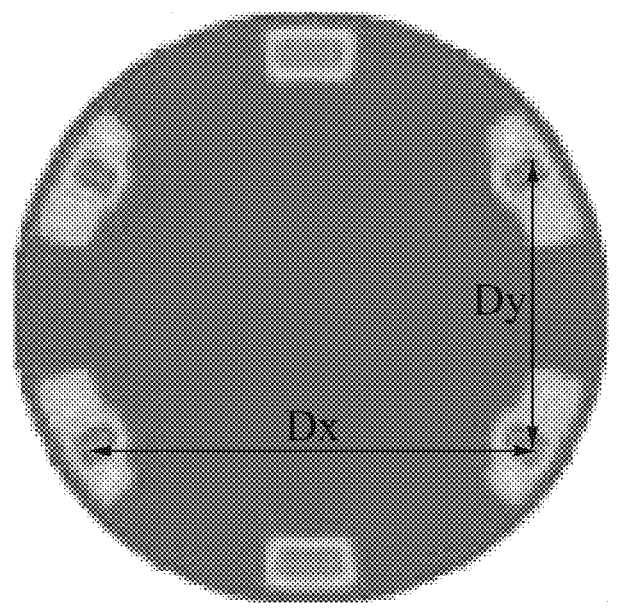

In some embodiments, the shape of one of the openings of the aperture plate 400 is different from the shape of another of the openings. FIGS. 6A-6C show that the shapes of the first opening 410 for the first pole and the fourth opening 440 of the fourth pole are the same as each other and different from the shapes of the remaining openings in some embodiments.

In some embodiments, the light intensity per unit area of the first opening 410 for the first pole and the fourth opening 440 of the fourth pole are greater than the light intensity per unit area of the remaining openings. In other embodiments, the light intensity per unit area of the first opening 410 for the first pole and the fourth opening 440 of the fourth pole are smaller than the light intensity per unit area of the remaining openings.

In some embodiments, the adjustment of the configuration of the aperture plate 400 is realized by replacing one aperture with another aperture depending on the pattern layout and/or the desired hexapole illumination system.

Figure 7:
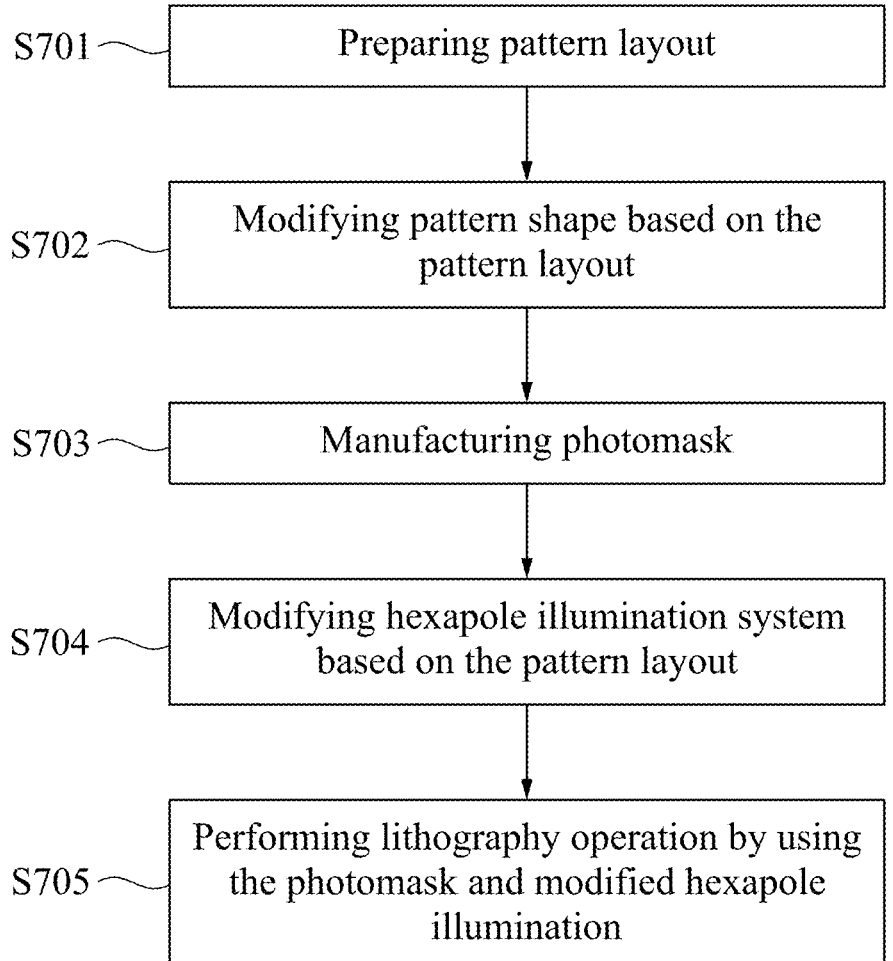
FIG. 7 shows a flow chart of manufacturing a semiconductor device according to an embodiment of the present disclosure.

FIG. 7 shows a flow chart of manufacturing a semiconductor device according to an embodiment of the present disclosure. It is understood that additional operations can be provided before, during, and after processes shown by FIG. 7, and some of the operations described below can be replaced or eliminated, for additional embodiments of the method. The order of the operations/processes may be interchangeable.

At S701, an original pattern layout, for example a pattern consistent with FIG. 2, is prepared. In some embodiments, the pattern layout is for forming holes for storage nodes of a DRAM and a plurality of patterns are arranged in a staggered matrix. At S702, the pattern shape (originally square or rectangular) is modified into a non-rectangular polygonal (e.g., octagonal) shape. In some embodiments, the modification is made based on the original pattern layout. In some embodiments, as set forth above, the dimensions of the sides of the polygonal shape are determined based on the pattern pitches in the X direction and the Y direction. At S703, a photomask is manufactured using the modified layout data. In some embodiments, the photomask is a transmissive mask and in other embodiments, the photomask is reflective mask.

At S704, the configuration of an aperture plate of the exposure apparatus is determined and the aperture plate is thus modified. In some embodiments, the aperture plate is for a hexapole illumination having six openings (light transmissive portions), and one or more of the size, shape or location of the openings are optimized based on the pattern layout, such as the pattern pitches in the X direction and the Y direction of the staggered matrix.

At S705, a lithography (exposure) operation is performed using the photomask manufactured at S703 and the aperture plate obtained at S704. In some embodiments, the photomask is loaded into an exposure apparatus and placed on the mask stage. A substrate, such as a semiconductor wafer, over which a photo resist layer is formed is loaded into the exposure apparatus, and then the patterns on the photomask is projected onto the photo resist layer through projection optics. After the exposure, the photo resist layer is developed to form a resist pattern, and then a subsequent operation, such as an etching operation, is performed.

FIGS. 8-12 show cross sectional views of the various stage of manufacturing a semiconductor device including a DRAM according to an embodiment of the present disclosure. It is understood that additional operations can be provided before, during, and after processes shown by FIGS. 8-12, and some of the operations described below can be replaced or eliminated for additional embodiments of the method. The order of the operations/processes may be interchangeable. In some embodiments, the semiconductor devices including a DRAM cell is a system LSI or system-on-chip (SOC) device including a logic circuit (e.g., a microprocessor) and a DRAM.

Figures 8, 9:
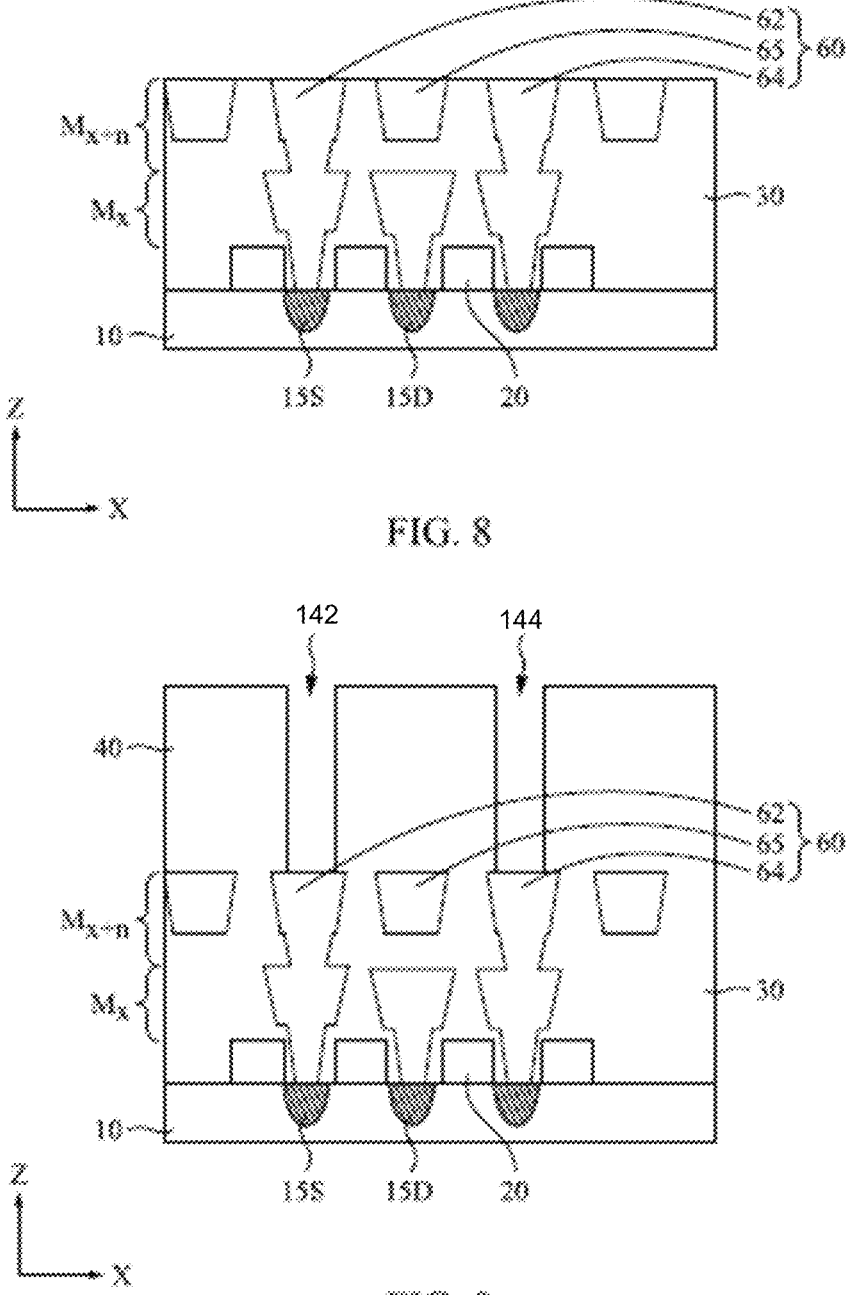
FIGS. 8, 9, 10A, 10B, 11 and 12 show cross sectional views of the various stages of a sequential manufacturing operation of a semiconductor device in accordance with embodiments of the present disclosure.

As shown in FIG. 8, lower wiring patterns 60 including the first, second and third lower wiring patterns 62, 64 and 65 are formed over a substrate 10. In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. The substrate 10 includes isolation regions in some embodiments, such as shallow trench isolation (STI), defining active regions and separating one or more electronic elements from other electronic elements. In some embodiments, transistors, such as field effect transistors (FETs), are disposed over the substrate 10. In some embodiments, the FET includes a gate electrode 20, a source 15S and a drain 15D. In the present disclosure, a source and a drain are interchangeably used and may have the same structure. In some embodiments, the FET is a planar FET, a fin FET (Fin FET) or a gate-all-around (GAA) FET.

In some embodiments, multiple wiring layers $M_x$ are formed over the FETs, where x is 1, 2, 3, . . . . In some embodiments, when the wiring layers $M_x$ include wiring patterns extending in the X direction, the wiring layers $M_{x+1}$ include wiring patterns extending in the Y direction. In other words, X-direction metal wiring patterns and Y-direction metal wiring patterns are alternately stacked. In some embodiments, x is up to 20. Each of the wiring layers includes an interlayer dielectric (ILD) layer or an inter-metal dielectric (IMB) layer, a metal layer and a via connected to the metal layer in some embodiments. In some embodiments, the wiring layer includes the via formed below the metal layer, and in other embodiments, the wiring layer is defined to include the via above the metal layer.

In some embodiments, the lower wiring patterns 60, which correspond to $M_{x+1}$ wiring layer, are formed by using a damascene technology, and include one or more layers of conductive material, such as Cu, Al, W, Co, Ti or Ta or an alloy thereof. The lower wiring patterns 60 are formed at the upper portion of a first ILD layer 30.

Then, as shown in FIG. 9, a second ILD layer 40 is formed over the first ILD layer 30 and the lower wiring patterns 60. In some embodiments, the first and second ILD layers 30 and 40 include one or more layers of silicon oxide, SiON, SiOCN, SiCN, SiOC, an organic material, a low-k dielectric material, or an extreme low-k dielectric material.

Further, as shown in FIG. 9, a plurality of trenches including a first trench 142 and a second trench 144 are formed in the second ILD layer 40 by using one or more lithography and etching operations. The lithography operation includes one or more embodiments as set forth above, in which the patterns are arranged in the staggered matrix, and each pattern has an octagonal shape in some embodiments. As shown in FIG. 9, the trenches 142 and 144 reach the wiring patterns 62 and 64 of the Mx+n wiring layer, respectively.

Figure 10A:
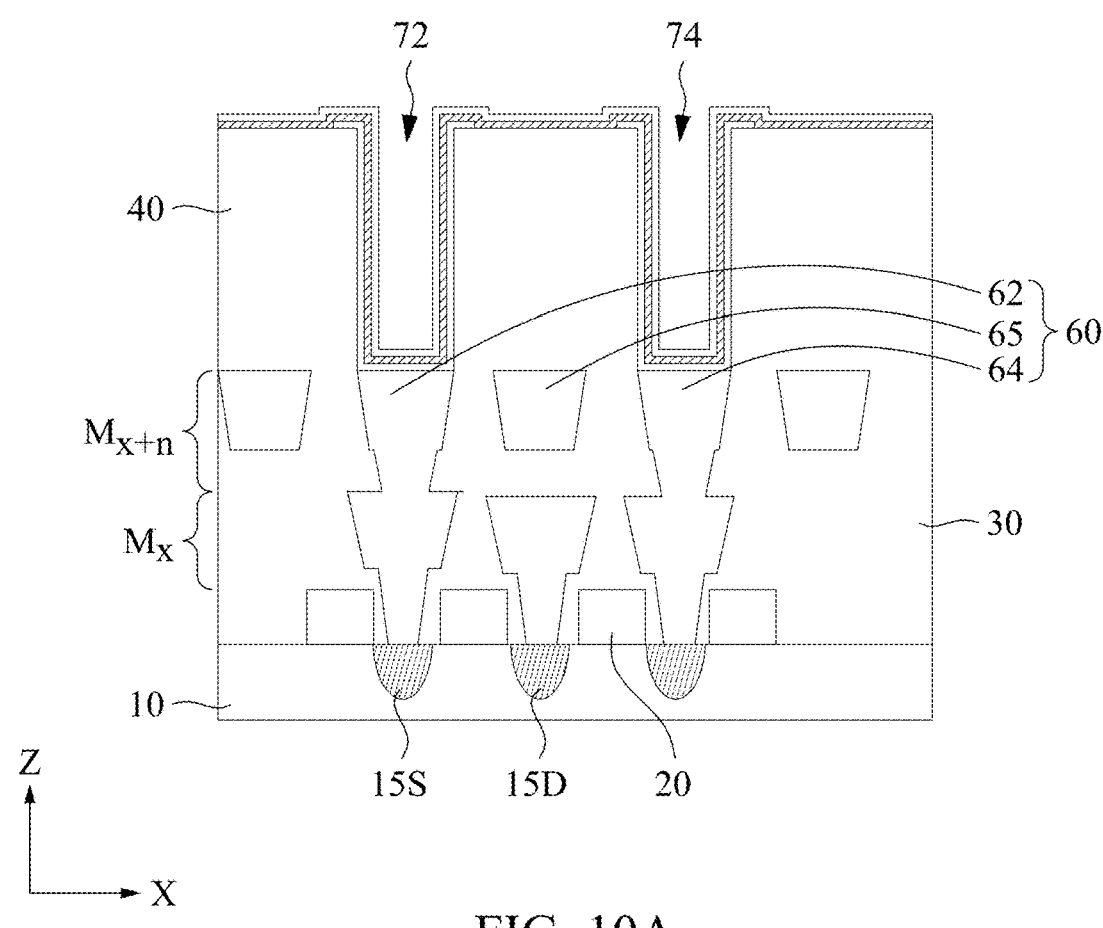
Figure 10B:
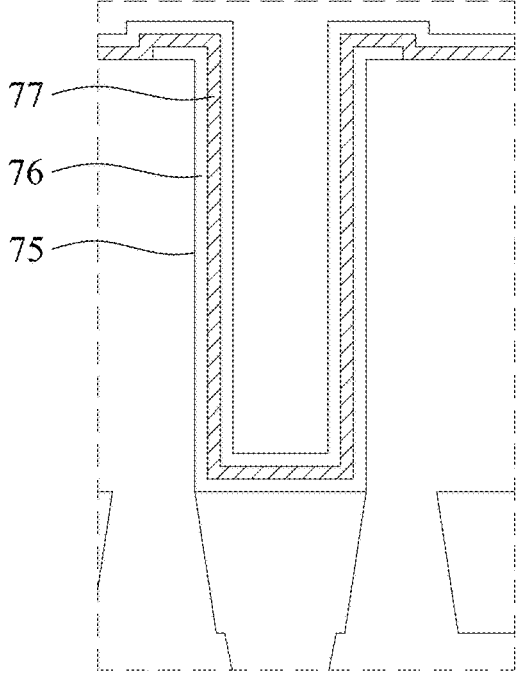

Then, as shown in FIGS. 10A and 10B, metal-insulator-metal (MIM) capacitors including stacked layers of conductive material and insulating material are formed in the trenches and over the upper surface of the second ILD layer 40. FIG. 10B is an enlarged view of the MIM capacitor.

In some embodiments, the MIM capacitor includes a first MIM capacitor 72 and a second MIM capacitor 74. Each of the MIM capacitors include a lower conductive layer 75, an insulating material layer 76 and an upper conductive layer 77. In some embodiments, the upper conductive layer is a plate electrode coupled to a fixed potential, such as the ground.

In some embodiments, the lower and upper conductive layers include one or more layers of Cu, Al, W, Co, Ti or Ta or an alloy thereof. In certain embodiments, one or more layers of Ti, TiN, Ta or TaN are used. In some embodiments, the conductive layers are formed by chemical vapor deposition (CVD), physical vapor deposition (PVD) including sputtering or atomic layer deposition (ALD). In some embodiments, the thickness of the conductive layers is in a range from about 1 nm to about 10 nm and is in a range from about 2 nm to about 5 nm in other embodiments, depending on the design and/or process requirements. In some embodiments, the insulating layer 76 includes one or more layers of a metal oxide or a silicate of Hf, Al, Zr, combinations thereof, and multi-layers thereof. In certain embodiments, hafnium oxide is used. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$, and $LaAlO_3$, and the like. In some embodiments, the insulating layer 76 has a thickness in a range from about 1 nm to about 10 nm, and in a range from about 2 nm to about 5 nm in other embodiments, depending on design and/or process requirements. The insulating layer 76 is formed by CVD or ALD. In some embodiments, three or more conductive layer and two or more insulating layers are formed to form the MIM capacitors.

Figure 11:
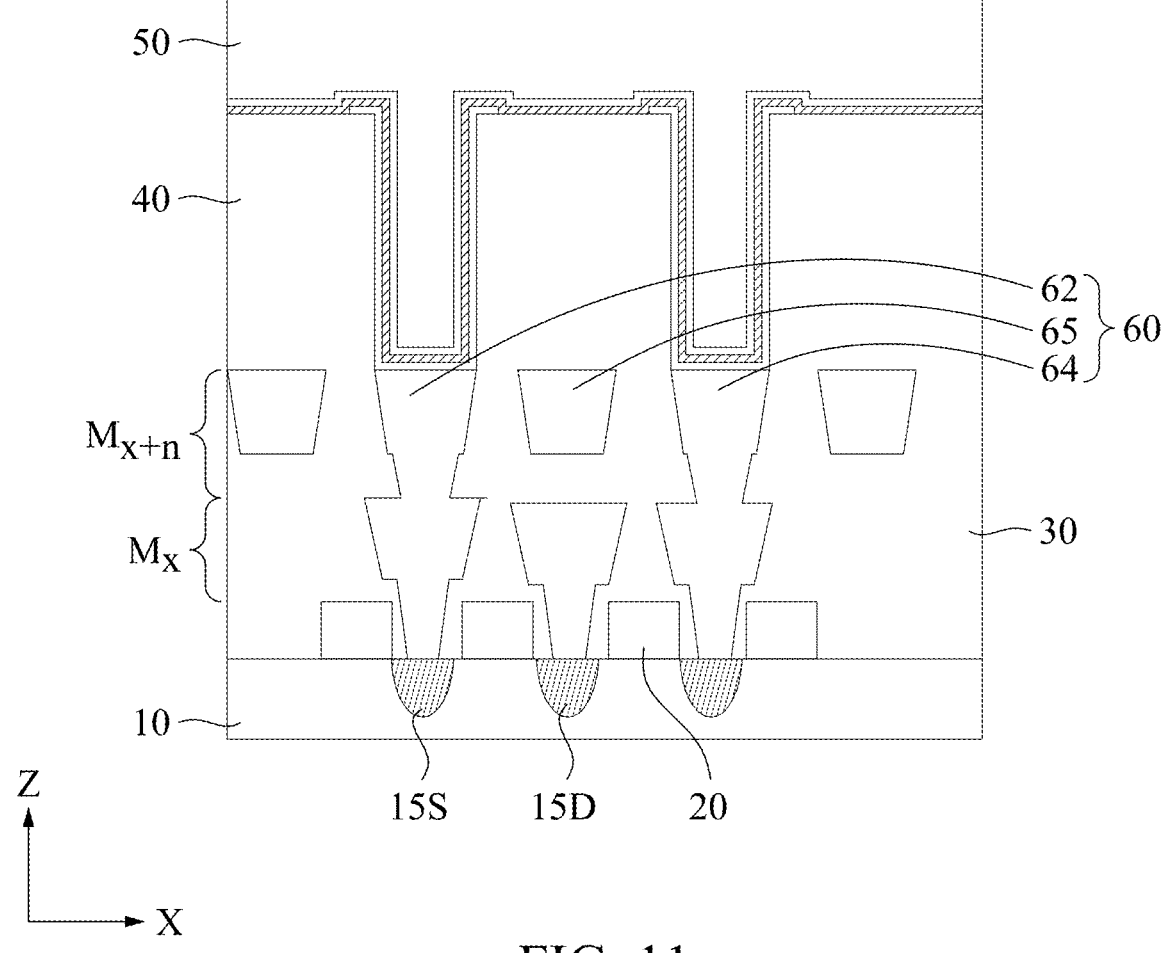

Next, as shown in FIG. 11, a third ILD layer 50 is formed over the MIN capacitors. In some embodiments, the third ILD layer 50 includes one or more layers of silicon oxide, SiON, SiOCN, SiCN, SiOC, an organic material, a low-k dielectric material, or an extreme low-k dielectric material.

Figure 12:
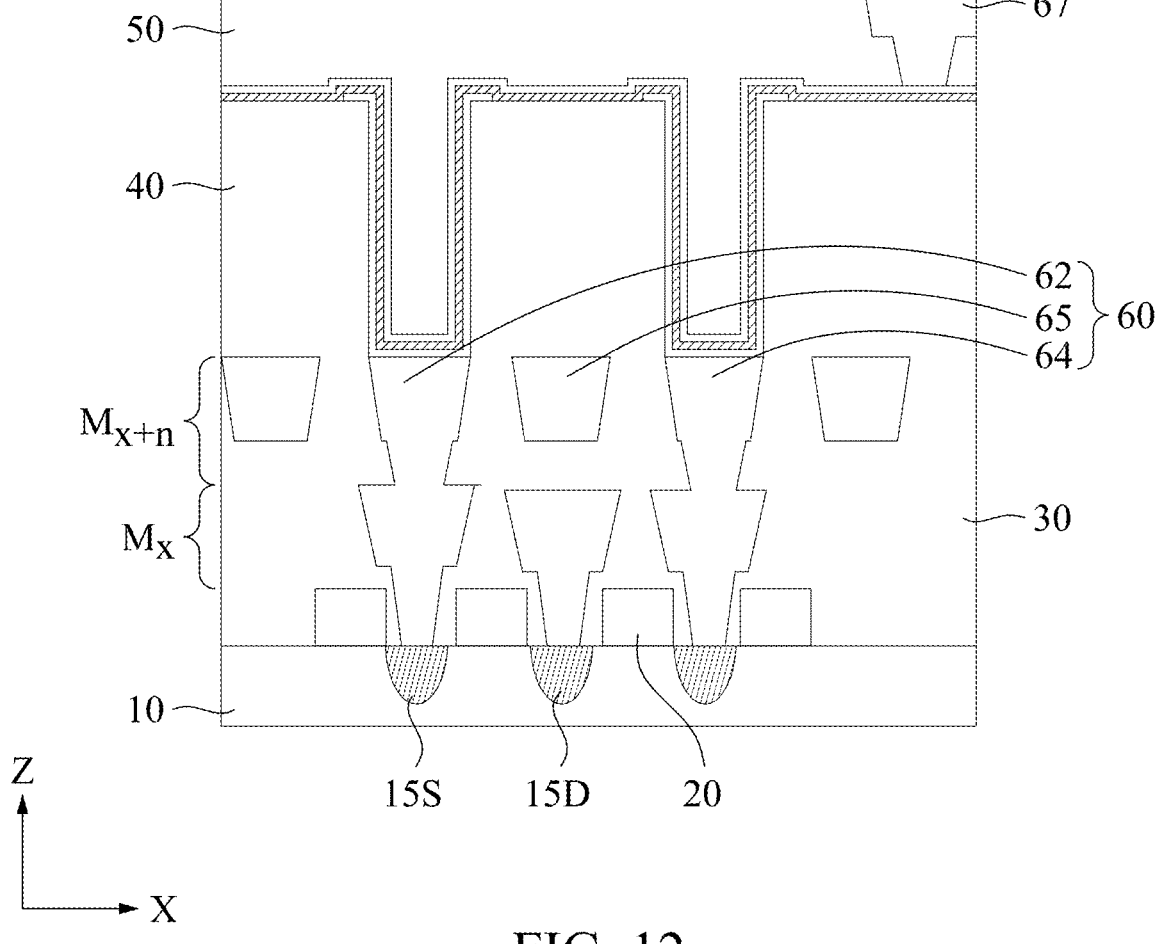

Further, as shown in FIG. 12, an upper conductive layer 67 coupled to the plate electrode 77 is formed in the third ILD layer 50. In some embodiments, the upper conductive layer 67 corresponds to $M_{x+n}$ wiring layer, where n is 2, 3, 4 or 5.

In some embodiments, the staggered matrix of hole patterns is also employed to form a contact between the MIM capacitor and the sources or drains, and can be applied to any other patterns having staggered matrix.

Subsequently, further CMOS processes are performed to form various features such as additional interlayer dielectric layers, contacts/vias, interconnect metal layers, and passivation layers, etc.

In the embodiments of the present disclosure, by modifying an original square or rectangular pattern (for holes) into an octagonal shape having non-uniform side widths it is possible to improve CD uniformity of the holes formed in a photo resist layer. In some embodiments, the CD uniformity improves by 3-5% in 3σ. Further, since the trenches for the MIM capacitor have a higher CD uniformity by using the embodiments as set forth above, the properties of the DRAM can be improved.

It will be understood that not all advantages have been necessarily discussed herein, no particular advantage is required for all embodiments or examples, and other embodiments or examples may offer different advantages.

In accordance with another aspect of the present disclosure, in pattern formation method, a photomask is loaded into a lithography apparatus, an exposure light is applied to a photo resist layer formed over a substrate through or via the photomask, and the photo resist layer is developed. The photomask includes a plurality of octagonal shape patterns periodically arranged in a first direction and a second direction crossing the first direction. A width Lx of horizontal sides extending in the first direction of each of the plurality octagonal shape patterns is different from a width Ly of vertical sides extending in the second direction of each of the plurality octagonal shape patterns. In one or more of the foregoing and following embodiments, the plurality of octagonal shape patterns arranged in a staggered manner, and includes even number rows in which some of the plurality of octagonal shape patterns are periodically arranged with a first pitch Px along the first direction, and odd number rows in which some of the plurality of octagonal shape patterns are periodically arranged with the first pitch Px along the first direction. The even number rows are periodically arranged with a pitch Py along the second direction, and the odd number rows are periodically arranged with the pitch Py along the second direction. The even number rows and the odd number rows are periodically arranged with a pitch Py/2 along the second direction, and the odd number rows are shifted along the first direction by Px/2 with respect to the even number rows. In one or more of the foregoing and following embodiments, Px<Py and Lx>Ly. In one or more of the foregoing and following embodiments, 0.5≤Px/Py≤0.7 and 1.05≤Lx/Ly≤1.15. In one or more of the foregoing and following embodiments, Px<Py and Lx<Ly. In one or more of the foregoing and following embodiments, 0.5≤Px/Py≤0.7 and 0.85≤Lx/Ly≤0.95. In one or more of the foregoing and following embodiments, the lithography apparatus comprises a hexapole illumination system.

In accordance with another aspect of the present disclosure, in a pattern formation method, a photomask is loaded into a lithography apparatus, an exposure light is applied to a photo resist layer formed over a substrate through or via the photomask, and the photo resist layer is developed. The photomask includes a plurality of octagonal shape patterns periodically arranged a staggered manner along a first direction and a second direction crossing the first direction. A width Lx of horizontal sides extending in the first direction of each of the octagonal shape is different from a width Ly of vertical sides extending in the second direction of each of the octagonal shape. The lithography apparatus comprises a hexapole illumination system a first pole, a second pole, a third pole, a fourth pole, a fifth pole and a sixth pole arranged along a circle in a clockwise direction. A distance Dx between a center of the second pole and a center of the sixth pole is different from a distance Dy between the center of the second pole and a center of the third pole. In one or more of the foregoing and following embodiments, the plurality of octagonal shape patterns includes even number rows in which some of the plurality of octagonal shape patterns are periodically arranged with a first pitch Px along the first direction, and odd number rows in which some of the plurality of octagonal shape patterns are periodically arranged with the first pitch Px along the first direction. The even number rows are periodically arranged with a pitch Py along the second direction, and the odd number rows are periodically arranged with the pitch Py along the second direction. The even number rows and the odd number rows are periodically arranged with a pitch Py/2 along the second direction, and the odd number rows are shifted along the first direction by Px/2 with respect to the even number rows. In one or more of the foregoing and following embodiments, the first pole and the fourth pole are arranged along the second direction, and the second pole and the sixth pole, and the third pole and the fifth pole are symmetrically arranged with respect to a line connecting the first pole and the fourth pole. In one or more of the foregoing and following embodiments, Px<Py, Lx>Ly and Dx>Dy. In one or more of the foregoing and following embodiments, 0.5≤Px/Py≤0.7, 1.05≤Lx/Ly≤1.15 and 1.5≤Dx/Dy≤1.7. In one or more of the foregoing and following embodiments, Px>Py, Lx<Ly and Dx<Dy. In one or more of the foregoing and following embodiments, an light intensity of the first pole and the fourth pole is greater than a light intensity of the second pole, the third pole, the fifth pole and the sixth pole. In one or more of the foregoing and following embodiments, Px<Py, 300 nm≤Px≤500 nm and 480 nm≤Py≤800 nm on the photomask.

In accordance with another aspect of the present disclosure, in a pattern formation method, a pattern layout including a plurality of rectangular shape patterns periodically arranged a staggered matrix is obtained, In the staggered matrix, a plurality of pattern rows in which some of the rectangular shape patterns are periodically arranged with a first pitch Px along a first direction and the plurality of pattern rows are periodically arranged with a half of a second pitch Py in a second direction crossing the first direction. The plurality of rectangular shape patterns are modified into a plurality of octagonal shape patterns, respectively, based on the first pitch and the second pitch. A photomask is manufactured using mask date comprising the plurality of octagonal shape patterns. By using an lithography apparatus, a photo resist layer formed over a substrate is exposed with an exposure light through or via the photomask and the photo resist layer is developed. Px is different from Py, and a width Lx of horizontal sides extending in the first direction of each of the plurality octagonal shape patterns is different from a width Ly of vertical sides extending in the second direction of each of the plurality octagonal shape patterns. In one or more of the foregoing and following embodiments, the lithography apparatus comprises a hexapole illumination system a first pole, a second pole, a third pole, a fourth pole, a fifth pole and a sixth pole arranged along a circle in a clockwise direction, and a distance Dx between a center of the second pole and a center of the sixth pole is different from a distance Dy between the center of the second pole and a center of the third pole. In one or more of the foregoing and following embodiments, Px<Py, Lx>Ly and Dx>Dy. In one or more of the foregoing and following embodiments, 0.5≤Lx/Ly≤0.7, 1.05≤Lx/Lx≤1.15 and 1.5≤Dx/Dy≤1.7. In one or more of the foregoing and following embodiments, a light intensity of at least one of the first to sixth poles is different from a light intensity of another of the first to sixth poles. In one or more of the foregoing and following embodiments, the plurality of rectangular shape patterns are for a plurality of storage node patterns of a dynamic random access memory.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method, comprising:

causing light generated by a light source of a lithography apparatus to pass through an aperture plate and to impinge on a photomask to generate exposure light, wherein the photomask includes a plurality of octagonal shape patterns periodically arranged with a first pitch Px in a first direction and with a second pitch Py in a second direction crossing the first direction;

causing a mechanism of the aperture plate to adjust a light transmissive area of the aperture plate, wherein the aperture plate comprises a hexapole illumination system including a first pole, a second pole, a third pole, a fourth pole, a fifth pole and a sixth pole arranged in order along a circle, a distance between a center of the second pole and a center of the sixth pole is Dx, a distance between the center of the second pole and a center of the third pole is Dy, and in response to Px<Py, the light transmissive area of the aperture plate is adjusted such that Dx>Dy;

applying the exposure light to a photo resist layer formed over a substrate; and developing the photo resist layer, wherein:

each of the plurality of octagonal shape patterns has a width Lw along the first direction, and a width Lx of horizontal sides extending in the first direction of each of the plurality of octagonal shape patterns is smaller than the width Lw, and is different from a width Ly of vertical sides extending in the second direction of each of the plurality octagonal shape patterns.

2. The pattern formation method of claim 1, wherein:

the plurality of octagonal shape patterns are arranged in a staggered manner, and includes:

even number rows in which some of the plurality of octagonal shape patterns are periodically arranged with the first pitch Px along the first direction, and odd number rows in which some of the plurality of octagonal shape patterns are periodically arranged with the first pitch Px along the first direction, the even number rows are periodically arranged with the pitch Py along the second direction, the odd number rows are periodically arranged with the pitch Py along the second direction, the even number rows and the odd number rows are periodically arranged with a pitch Py/2 along the second direction, and the odd number rows are shifted along the first direction by Px/2 with respect to the even number rows.

3. The pattern formation method of claim 2, wherein Px<Py and Lx>Ly.

4. The pattern formation method of claim 3, wherein 0.5≤Px/Py≤0.7 and 1.05≤Lx/Ly≤1.15.

5. The pattern formation method of claim 2, wherein Px<Py and Lx<Ly.

6. The pattern formation method of claim 5, wherein 0.5≤Px/Py≤0.7 and 0.85≤Lx/Ly≤0.95.

7. The pattern formation method of claim 2, wherein the lithography apparatus comprises a hexapole illumination system.

8. A pattern formation method, comprising:

loading a photomask into a lithography apparatus, wherein the photomask includes a plurality of octagonal shape patterns periodically arranged with a first pitch Px in a first direction and with a second pitch Py in a second direction crossing the first direction;

applying an exposure light to a photo resist layer formed over a substrate through or via the photomask, wherein the lithography apparatus comprises an off-axis illumination system comprising an aperture plate having a mechanism that adjusts a light transmissive area of the aperture plate, the aperture plate comprises a hexapole illumination system including a first pole, a second pole, a third pole, a fourth pole, a fifth pole and a sixth pole arranged in order along a circle, a distance between a center of the second pole and a center of the sixth pole is Dx, a distance between the center of the second pole and a center of the third pole is Dy, and in response to Px<Py, the light transmissive area of the aperture plate is adjusted such that Dx>Dy; and developing the photo resist layer, wherein:

each of the plurality of octagonal shape patterns has a width Lw along the first direction, and a width Lx of horizontal sides extending in the first direction of each of the plurality of octagonal shape patterns is smaller than the width Lw, and is different from a width Ly of vertical sides extending in the second direction of each of the plurality of octagonal shape patterns.

9. The pattern formation method of claim 8, wherein:

the plurality of octagonal shape patterns includes:

even number rows in which some of the plurality of octagonal shape patterns are periodically arranged with the first pitch Px along the first direction, and odd number rows in which some of the plurality of octagonal shape patterns are periodically arranged with the first pitch Px along the first direction, the even number rows are periodically arranged with the pitch Py along the second direction, the odd number rows are periodically arranged with the pitch Py along the second direction, the even number rows and the odd number rows are periodically arranged with a pitch Py/2 along the second direction, and the odd number rows are shifted along the first direction by Px/2 with respect to the even number rows.

10. The pattern formation method of claim 9, wherein:

the first pole and the fourth pole are arranged along the second direction, and the second pole and the sixth pole, and the third pole and the fifth pole are symmetrically arranged with respect to a line connecting the first pole and the fourth pole.

11. The pattern formation method of claim 10, wherein Px<Py, Lx>Ly and Dx>Dy.

12. The pattern formation method of claim 11, wherein 0.5≤Px/Py≤0.7, 1.05≤Lx/Ly≤1.15 and 1.5≤Dx/Dy≤1.7.

13. The pattern formation method of claim 10, wherein Px>Py, Lx<Ly and Dx<Dy.

14. The pattern formation method of claim 10, wherein a light intensity of the first pole and the fourth pole is greater than a light intensity of the second pole, the third pole, the fifth pole and the sixth pole.

15. A pattern formation method, comprising:

providing a pattern layout including a plurality of octagonal shape patterns periodically arranged in a staggered matrix, wherein in the staggered matrix, a plurality of pattern rows in which some of the plurality of octagonal shape patterns are periodically arranged with a first pitch Px along a first direction and the plurality of pattern rows are periodically arranged with a half of a second pitch Py in a second direction crossing the first direction;

manufacturing a photomask using mask data comprising the plurality of octagonal shape patterns;

exposing, by using a lithography apparatus comprising an aperture plate having a mechanism that adjusts a light transmissive area of the aperture plate, a photo resist layer formed over a substrate with an exposure light through or via the photomask, wherein the aperture plate comprises a hexapole illumination system including a first pole, a second pole, a third pole, a fourth pole, a fifth pole and a sixth pole arranged in order along a circle, a distance between a center of the second pole and a center of the sixth pole is Dx, a distance between the center of the second pole and a center of the third pole is Dy, and in response to Px<Py, the light transmissive area of the aperture plate is adjusted such that Dx>Dy; and developing the photo resist layer, wherein:

Px is different from Py, each of the plurality of octagonal shape patterns has at least four sides, and a width Lw along the first direction, and a width Lx of horizontal sides extending in the first direction of each of the plurality of octagonal shape patterns is smaller than the width Lw, and is different from a width Ly of vertical sides extending in the second direction of each of the plurality of octagonal shape patterns, and the width Lx and the width Ly satisfy Lx>Ly when Px<Py, and Lx<Ly when Px<Py.

16. The pattern formation method of claim 15, wherein Px<Py, Lx>Ly and Dx>Dy.

17. The pattern formation method of claim 16, wherein 0.5≤Px/Py≤0.7, 1.05≤Lx/Ly≤1.15, and 1.5≤Dx/Dy≤1.7.

18. The pattern formation method of claim 15, wherein a light intensity of at least one of the first to sixth poles is different from a light intensity of another of the first to sixth poles.

19. The pattern formation method of claim 14, wherein the plurality of octagonal shape patterns are for a plurality of storage node patterns of a dynamic random access memory.

20. The pattern formation method of claim 15, wherein a light intensity of the first pole and the fourth pole is greater than a light intensity of the second pole, the third pole, the fifth pole, and the sixth pole.

* * * * *